United States Patent
Kaji et al.

(10) Patent No.: US 11,909,420 B2
(45) Date of Patent: Feb. 20, 2024

(54) SIGNAL GENERATION APPARATUS AND LINEARITY CORRECTION METHOD THEREOF

(71) Applicant: ANRITSU CORPORATION, Kanagawa (JP)

(72) Inventors: Ittetsu Kaji, Kanagawa (JP); Kayoko Horiuchi, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 0 days.

(21) Appl. No.: 17/808,165

(22) Filed: Jun. 22, 2022

(65) Prior Publication Data
US 2023/0006687 A1 Jan. 5, 2023

(30) Foreign Application Priority Data
Jun. 30, 2021 (JP) .................. 2021-108948

(51) Int. Cl.
*H03M 1/00* (2006.01)
*H03M 3/00* (2006.01)
*G01R 35/00* (2006.01)
*G01R 31/319* (2006.01)

(52) U.S. Cl.
CPC .......... *H03M 3/502* (2013.01); *H03M 3/386* (2013.01); *G01R 31/319* (2013.01); *G01R 35/00* (2013.01)

(58) Field of Classification Search
CPC ...... H03M 3/502; H03M 3/386; G01R 35/00; G01R 31/319
See application file for complete search history.

(56) References Cited

U.S. PATENT DOCUMENTS 10,317,503 B2 * 6/2019 Yamashita ......... G01R 31/3191

FOREIGN PATENT DOCUMENTS

JP           2003-018104 A        1/2003

* cited by examiner

*Primary Examiner* — Joseph J Lauture
(74) *Attorney, Agent, or Firm* — Pearne & Gordon LLP

(57) ABSTRACT

There are provided a signal generation unit that generates a predetermined digital signal, a level conversion unit that converts a level of the digital signal generated by the signal generation unit, a DA converter that converts the digital signal of which the level is converted by the level conversion unit into an analog signal in a predetermined intermediate frequency bandwidth, and a control unit that creates correction data for correcting a linearity of a level of an output signal of the DA converter for all frequencies to be used, based on actual data which is data of a level of an actual output signal when a setting of the level of the output signal of the DA converter is changed at a predetermined level interval, at a predetermined frequency, and converts a level of an input signal of the DA converter with the correction data.

6 Claims, 4 Drawing Sheets

SIGNAL GENERATION APPARATUS AND LINEARITY CORRECTION METHOD THEREOF

TECHNICAL FIELD

The present invention relates to a signal generation apparatus that generates a modulated wave in a desired frequency bandwidth.

BACKGROUND ART

As a signal generation apparatus that generates a modulated wave in a desired frequency bandwidth, there is known, for example, a signal generation apparatus that generates a modulated wave in a desired frequency bandwidth by frequency-converting an intermediate frequency signal generated by any signal generator with a mixer or the like.

Such a signal generation apparatus is incorporated in, for example, a mobile terminal test device or the like that tests a mobile communication terminal, and generates and outputs a test signal.

Patent Document 1 describes a mobile terminal test system that changes a signal level of a signal output from a signal generator with an attenuator and transmits the signal to a measurement target terminal, in which a calibration value for each frequency value is acquired based on each signal level in a case where a frequency of the signal output from the signal generator is sequentially changed.

RELATED ART DOCUMENT

Patent Document

[Patent Document 1] JP-A-2003-18104

DISCLOSURE OF THE INVENTION

Problem that the Invention is to Solve

However, in such a mobile terminal test system, the calibration value is acquired for each predetermined frequency, in an entire frequency bandwidth to be used, it takes time to acquire the calibration value.

Therefore, an object of the present invention is to provide a signal generation apparatus capable of creating correction data of all frequencies to be used from data in a limited frequency range, and easily correcting a linearity of a level of an output signal.

Means for Solving the Problem

According to an aspect of the present invention, there is provided a signal generation apparatus including: a signal generation unit that generates any digital signal; a level conversion unit that converts a level of the digital signal generated by the signal generation unit; a DA converter that converts the digital signal of which the level is converted by the level conversion unit into an analog signal having a predetermined frequency; an amplifier that amplifies the analog signal converted by the DA converter; a frequency conversion unit that converts the frequency of the analog signal amplified by the amplifier; a correction data storage unit (15); and a control unit (17), in which the DA converter is configured to adjust a level of an output signal, the control unit creates correction data for correcting a linearity of the level of the output signal of the DA converter, for all frequencies to be used, based on actual data which is data of a level of an actual output signal at a predetermined frequency when a setting of the level of the output signal of the DA converter is changed at a predetermined level interval, and stores the created correction data in the correction data storage unit, and the control unit causes the level conversion unit to convert a level of an input signal of the DA converter with the correction data stored in the correction data storage unit.

With this configuration, based on the actual data which is the data of the level of the actual output signal at the predetermined frequency when the setting of the level of the output signal of the DA converter is changed at the predetermined level interval, the correction data for correcting the linearity of the level of the output signal of the DA converter is created for all the frequencies to be used, and the level of the input signal of the DA converter is converted with the correction data. Therefore, it is possible to easily correct the linearity of the level of the output signal.

Further, in the signal generation apparatus according to the present invention, the control unit causes the level conversion unit to convert the level of the input signal of the DA converter with the correction data stored in the correction data storage unit only in a range in which the linearity of the level of the output signal of the DA converter is poor.

With this configuration, the correction operation is performed only in the range in which the linearity of the level of the output signal of the DA converter is poor. Therefore, it is possible to speed up the correction operation, and simplify the apparatus.

Further, in the signal generation apparatus according to the present invention, the control unit acquires the actual data only in a range in which the linearity of the level of the output signal of the DA converter is poor, creates the correction data, and stores the created correction data in the correction data storage unit.

With this configuration, the actual data is acquired only in the range in which the linearity of the level of the output signal of the DA converter is poor, and the correction data is created. Therefore, it is possible to easily create the correction data.

Further, according to another aspect of the present invention, there is provided a linearity correction method of a signal generation apparatus including a signal generation unit that generates any digital signal, a level conversion unit that converts a level of the digital signal generated by the signal generation unit, a DA converter that converts the digital signal of which the level is converted by the level conversion unit into an analog signal having a predetermined frequency, an amplifier that amplifies the analog signal converted by the DA converter, a frequency conversion unit that converts the frequency of the analog signal amplified by the amplifier, and a correction data storage unit (15), the method including: a step of acquiring actual data which is data of a level of an actual output signal at a predetermined frequency when a setting of a level of an output signal of the DA converter is changed at a predetermined level interval; a step of creating correction data for correcting a linearity of the level of the output signal of the DA converter for all frequencies to be used, based on the actual data, and storing the created correction data in the correction data storage unit; and a step of causing the level conversion unit to convert a level of an input signal of the DA converter with the correction data stored in the correction data storage unit.

Further, in the linearity correction method according to the present invention, in the step of converting the input signal of the DA converter, the input signal of the DA converter is converted with the correction data stored in the correction data storage unit only a range in which the linearity of the level of the output signal of the DA converter is poor.

Further, in the linearity correction method according to the present invention, in the step of creating the correction data and storing the created correction data in the correction data storage unit, the actual data is acquired only in a range in which the linearity of the level of the output signal of the DA converter is poor, the correction data is created, and the created correction data is stored in the correction data storage unit.

With this configuration, based on the actual data which is the data of the level of the actual output signal at the predetermined frequency when the setting of the level of the output signal of the DA converter is changed at the predetermined level interval, the correction data for correcting the linearity of the level of the output signal of the DA converter is created for all the frequencies to be used, and the level of the input signal of the DA converter is converted with the correction data. Therefore, it is possible to easily correct the linearity of the level of the output signal.

Advantage of the Invention

The present invention can provide a signal generation apparatus capable of creating correction data of all frequencies to be used from data in a limited frequency range, and easily correcting a linearity of a level of an output signal.

BEST MODE FOR CARRYING OUT THE INVENTION

Hereinafter, a signal generation apparatus according to an embodiment of the present invention will be described in detail with reference to the drawings.

Figure 1:
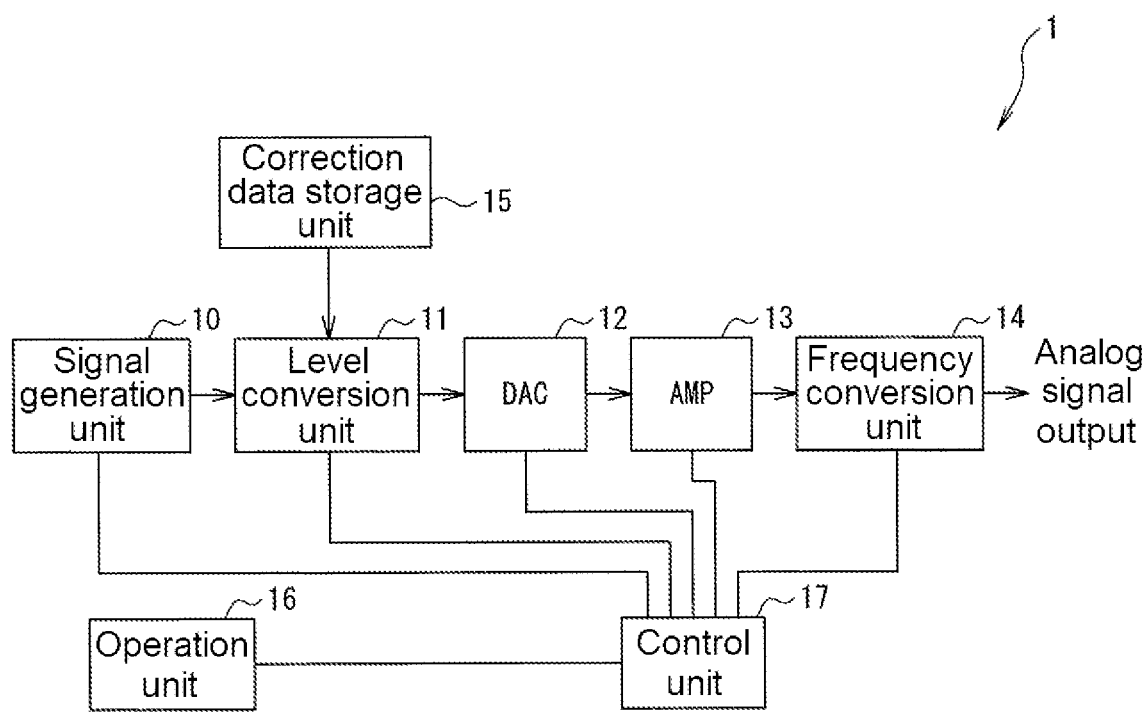
FIG. 1 is a block diagram of a signal generation apparatus according to an embodiment of the present invention.

In FIG. 1, a signal generation apparatus 1 according to the embodiment of the present invention includes a signal generation unit 10, a level conversion unit 11, a digital to analog converter (DAC) 12, an amplifier (AMP) 13, a frequency conversion unit 14, a correction data storage unit 15, an operation unit 16, and a control unit 17.

The signal generation unit 10 generates a predetermined digital signal. The level conversion unit 11 converts a signal level (gain) of a signal generated by the signal generation unit 10 and input as a digital signal to generate a digital signal. The DA converter 12 converts the digital signal converted by the level conversion unit 11 into an analog signal in a predetermined intermediate frequency bandwidth. The amplifier 13 amplifies the analog signal converted by the DA converter 12. The frequency conversion unit 14 performs frequency-conversion on the analog signal amplified by the amplifier 13 into an analog signal in a predetermined frequency bandwidth.

The correction data storage unit 15 is configured with a rewritable non-volatile storage medium such as a flash memory. The correction data storage unit 15 stores correction data for correcting the digital signal generated by the signal generation unit 10 with the level conversion unit 11.

The operation unit 16 includes input devices such as a keyboard, a mouse, and a touch panel, and outputs information input by an operation to the control unit 17.

The control unit 17 is configured to include computer units including a central processing unit (CPU), a random access memory (RAM), a read only memory (ROM), a hard disk device, and an input and output port (not illustrated).

The ROM and the hard disk device of this computer unit store various control constants, various maps, and the like, as well as a program for causing the computer unit to function as the control unit 17. That is, the computer unit functions as the control unit 17 by the CPU executing the program stored in the ROM and the hard disk device. The hard disk device may be a compact flash (CF) card by a flash memory.

The signal generation unit 10, the level conversion unit 11, the DA converter 12, the amplifier 13, the frequency conversion unit 14, and the operation unit 16 are connected to an input and output port of the control unit 17, and the control unit 17 and each unit can transmit and receive signals.

The signal generation apparatus 1 of the present embodiment can change a level of an output signal. The level of the output signal of the signal generation apparatus 1 is changed by the DA converter 12 changing the level of the output signal. The DA converter 12 can adjust the level of the output signal.

In a case of adjusting the level of the output signal with the DA converter 12, a linearity of the output level with respect to an adjustment amount of the level may not be desired due to a limit of a resolution of the DA converter 12, in some cases. In such a case, it is necessary to correct a signal level of an input signal of the DA converter 12 by the level conversion unit 11.

In a case of a configuration in which the DA converter 12 outputs an analog signal in an intermediate frequency bandwidth and the frequency conversion unit 14 converts a frequency as in the signal generation apparatus 1 of the present embodiment, a problem of the linearity is mainly due to an output performance of the DA converter 12, and the performance of the DA converter 12 determines a performance of the signal generation apparatus 1. Therefore, by acquiring data for correction at a limited frequency, the same effect as acquiring the data at all frequencies can be expected.

Further, since a performance of the linearity is mainly the performance of the DA converter 12, correction may be performed only in a range in which the linearity of the DA converter 12 is poor, for example, a range in which a difference between an adjustment amount of the level and a change amount of the actual output level is equal to or larger than a threshold value. The range of the level to be corrected may be determined by a result of actual measurement or may be determined by a condition required for the output signal.

Figure 2:
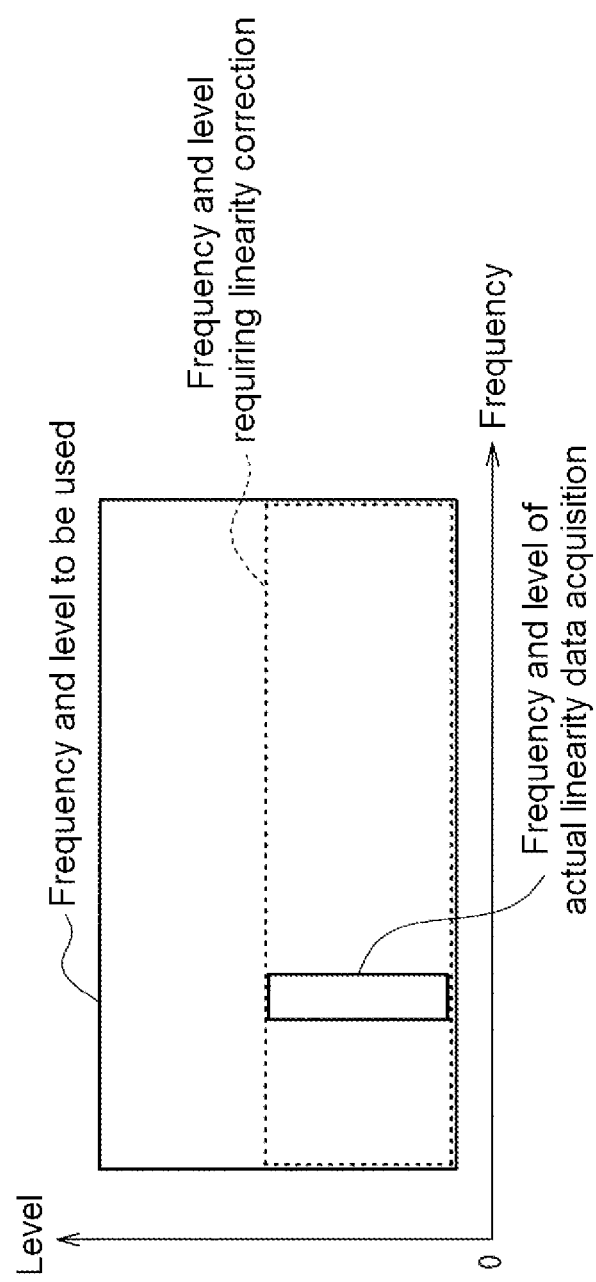
FIG. 2 illustrates an example of a range of a frequency and a level to be used by the signal generation apparatus according to the embodiment of the present invention, a range of a frequency and a level which need to be corrected, and a range of a frequency and a level for acquiring actual data.

For this reason, in the signal generation apparatus 1 of the present embodiment, as illustrated in FIG. 2, at a frequency and a level at which linearity correction is required among frequencies and levels to be used, based on actual data, which is data of a level of an output signal actually measured at a predetermined actual linearity data acquisition frequency, correction is performed on all frequencies at which the linearity correction is required.

The DA converter 12 adjusts the level of the output signal by, for example, adjusting an attenuation amount of the output signal. The attenuation amount of the output signal by the DA converter 12 can be adjusted by a control of the control unit 17.

For example, a spectrum analyzer, a power meter, or the like for measuring the level of the output signal of the signal generation apparatus 1 is connected to an output terminal of the signal generation apparatus 1, and a measurement result is output to the control unit 17, in a case of acquiring actual data at the actual linearity data acquisition frequency.

Then, for example, by an operation to the operation unit 16, creation of correction data is selected, and a frequency or a level range for the actual data acquisition is set.

When the creation of the correction data is selected by the operation to the operation unit 16 and the frequency and the level range of actual data acquisition is input, the control unit 17 acquires the actual data, and creates the correction data.

The control unit 17 generates, for example, an additive white Gaussian noise (AWGN) signal in the signal generation unit 10, and changes an attenuation amount of the DA converter 12 within a set range, for example, in 1 dB unit to acquire a measurement result of the level of the output signal at a set frequency.

From the acquired measurement result, the control unit 17 calculates a conversion value (correction amount) in the level conversion unit 11, for example, for each attenuation amount of the DA converter 12 so that the level of the output signal has a linearity, that is, a difference between a set attenuation amount and a attenuation amount of the actual output signal is equal to or less than a predetermined value.

The control unit 17 converts the calculated conversion value (correction amount) at all frequencies and develops the resultant value, and creates, for example, a table for determining the conversion value (correction amount) with the attenuation amount and the frequency, as correction data.

The control unit 17 stores the table of the created correction data in the correction data storage unit 15, and applies the table so that the level conversion unit 11 corrects an input signal of the DA converter 12 based on the correction data.

The actual measurement may be performed separately, and only data of the measurement result may be input to the control unit 17 to create the correction data. In this case, all data of the level to be used may be input to the control unit 17, and the control unit 17 may determine the range of the level at which the linearity correction is required.

A linearity correction process by the signal generation apparatus 1 according to the present embodiment configured as described above will be described with reference to FIG. 3. A correction data creation process to be described below is started when creation of correction data is selected by an operation to the operation unit 16.

In step S1, the control unit 17 inputs ranges of a frequency and a level for actual data acquisition, and determines the input ranges of the frequency and the level for the actual data acquisition as a linearity correction range. A parameter for determining the linearity correction range may be input to determine the linearity correction range. After executing the process in step S1, the control unit 17 executes the process in step S2.

In step S2, the control unit 17 acquires actual data in the determined linearity correction range by measurement. After executing the process in step S2, the control unit 17 executes the process in step S3.

In step S3, the control unit 17 creates a table of correction data based on the acquired actual data. After executing the process in step S3, the control unit 17 executes the process in step S4.

In step S4, the control unit 17 stores the created correction data in the correction data storage unit 15, and applies the correction data. After executing the process in step S4, the control unit 17 ends the linearity correction process.

Figure 3:
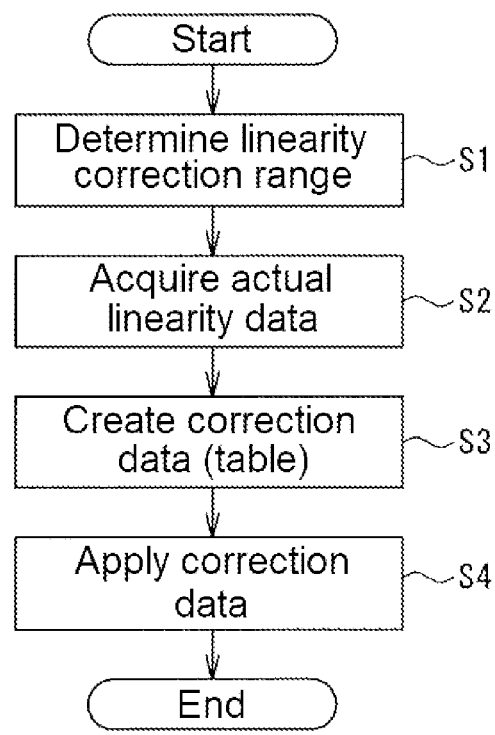
FIG. 3 is a flowchart illustrating a procedure of a linearity correction process of the signal generation apparatus according to the embodiment of the present invention.
Figure 4:
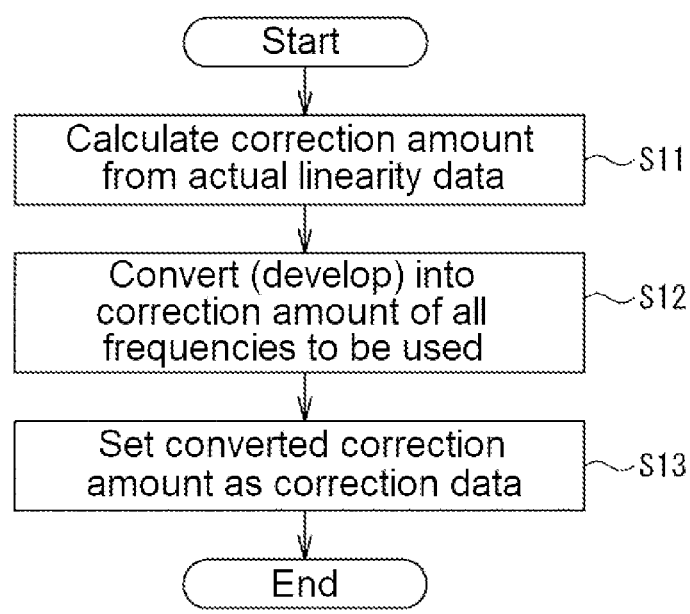
FIG. 4 is a flowchart illustrating a procedure of a correction data creation process of the signal generation apparatus according to the embodiment of the present invention.

Next, the correction data creation process in step S3 in FIG. 3 will be described with reference to FIG. 4.

In step S11, the control unit 17 calculates a correction amount for each attenuation amount from the actual data of the measured linearity correction range. After executing the process in step S11, the control unit 17 executes the process in step S12.

In step S12, the control unit 17 converts the calculated correction amount for all frequencies to be used, and develops the correction amount. After executing the process in step S12, the control unit 17 executes the process in step S13.

In step S13, the control unit 17 uses the converted correction amount as correction data. After executing the process in step S13, the control unit 17 ends the correction data creation process.

As described above, in the above-described embodiment, the control unit 17 changes an attenuation amount of the DA converter 12 in a predetermined level unit within a set range, measures a level of an output signal at a set frequency, calculates a conversion value (correction amount) in the level conversion unit 11 from the measured result so that the level of the output signal of the DA converter 12 has a linearity, converts and develops the calculated conversion value (correction amount) for all frequencies, creates a table for determining a conversion value (correction amount) with an attenuation amount and a frequency as correction data, store the created table of the correction data in the correction data storage unit 15, and applies the table so that the level conversion unit 11 corrects an input signal of the DA converter 12 with the correction data.

As a result, the correction data for all the frequencies to be used is created from the data in the limited frequency range, and the input signal of the DA converter 12 is corrected with the correction data. Therefore, it is possible to easily correct the linearity of the level of the output signal.

In addition, even an inexpensive DA converter having a low resolution can generate a signal with a high-level accuracy.

Further, the control unit 17 corrects only a range in which the linearity of the level of the output signal of the DA converter 12 is poor.

As a result, the correction operation is performed only in the range in which the linearity of the level of the output signal of the DA converter 12 is poor. Therefore, it is possible to speed up the correction operation, and simplify the apparatus.

Further, the control unit 17 acquires actual data only in the range in which the linearity of the level of the output signal of the DA converter 12 is poor so as to create correction data.

As a result, the actual data is acquired only in the range in which the linearity of the level of the output signal of the DA converter 12 is poor, and the correction data is created. Therefore, it is possible to easily create the correction data.

Although the embodiment of the present invention is disclosed, it is apparent that the embodiment can be modified by those skilled in the art without departing from the scope of the present invention. All such modifications and equivalents are intended to be included in the following claims.

DESCRIPTION OF REFERENCE NUMERALS AND SIGNS

1 Signal generation apparatus
10 Signal generation unit
11 Level conversion unit
12 DA converter
13 Amplifier
14 Frequency conversion unit
15 Correction data storage unit
16 Operation unit
17 Control unit

What is claimed is:

1. A signal generation apparatus comprising:
a signal generation unit that generates any digital signal;
a level conversion unit that adjusts a level of the digital signal generated by the signal generation unit;
a DA converter that converts the digital signal of which the level is adjusted by the level conversion unit into an analog signal having a predetermined frequency;
an amplifier that amplifies the analog signal converted by the DA converter;
a frequency conversion unit that converts the frequency of the analog signal amplified by the amplifier;
a correction data storage unit; and
a control unit,
wherein the DA converter is configured to adjust a level of an output signal,
the control unit creates correction data for correcting a linearity of the level of the output signal of the DA converter, for all frequencies to be used, based on actual data which is data of a level of an actual output signal at a predetermined frequency when a setting of the level of the output signal of the DA converter is changed at a predetermined level interval, and stores the created correction data in the correction data storage unit, and
the control unit causes the level conversion unit to adjust the level of the digital signal, which is an input signal of the DA converter, based on the correction data stored in the correction data storage unit.

2. The signal generation apparatus according to claim 1, wherein the control unit causes the level conversion unit to convert the level of the input signal of the DA converter with the correction data stored in the correction data storage unit only in a range in which the linearity of the level of the output signal of the DA converter is poor.

3. The signal generation apparatus according to claim 1, wherein the control unit acquires the actual data only in a range in which the linearity of the level of the output signal of the DA converter is poor, creates the correction data, and stores the created correction data in the correction data storage unit.

4. A linearity correction method of a signal generation apparatus including a signal generation unit that generates any digital signal, a level conversion unit that adjusts a level of the digital signal generated by the signal generation unit, a DA converter that converts the digital signal of which the level is adjusted by the level conversion unit into an analog signal having a predetermined frequency, an amplifier that amplifies the analog signal converted by the DA converter, a frequency conversion unit that converts the frequency of the analog signal amplified by the amplifier, and a correction data storage unit, the method comprising:
a step of acquiring actual data which is data of a level of an actual output signal at a predetermined frequency when a setting of a level of an output signal of the DA converter is changed at a predetermined level interval;
a step of creating correction data for correcting a linearity of the level of the output signal of the DA converter for all frequencies to be used, based on the actual data, and storing the created correction data in the correction data storage unit; and
a step of causing the level conversion unit to adjust the level of the digital signal, which is an input signal of the DA converter, based on the correction data stored in the correction data storage unit.

5. The linearity correction method according to claim 4, wherein in the step of converting the input signal of the DA converter, the input signal of the DA converter is converted with the correction data stored in the correction data storage unit only a range in which the linearity of the level of the output signal of the DA converter is poor.

6. The linearity correction method according to claim 4, wherein in the step of creating the correction data and storing the created correction data in the correction data storage unit, the actual data is acquired only in a range in which the linearity of the level of the output signal of the DA converter is poor, the correction data is created, and the created correction data is stored in the correction data storage unit.

* * * * *